Nov. 21, 1950 R. W. BECKWITH 2,531,103

FREQUENCY SHIFT OSCILLATOR CIRCUIT

Filed Nov. 17, 1948 2 Sheets-Sheet 1

Inventor:
Robert W. Beckwith,
by Merton D. Moore
His Attorney.

Nov. 21, 1950 R. W. BECKWITH 2,531,103

FREQUENCY SHIFT OSCILLATOR CIRCUIT

Filed Nov. 17, 1948 2 Sheets-Sheet 2

Inventor:
Robert W. Beckwith,
by Merton D. Moore
His Attorney.

Patented Nov. 21, 1950

2,531,103

UNITED STATES PATENT OFFICE 2,531,103

FREQUENCY SHIFT OSCILLATOR CIRCUIT

Robert W. Beckwith, North Syracuse, N. Y., assignor to General Electric Company, a corporation of New York Application November 17, 1948, Serial No. 60,539

5 Claims. (Cl. 332—26)

Figure 1:
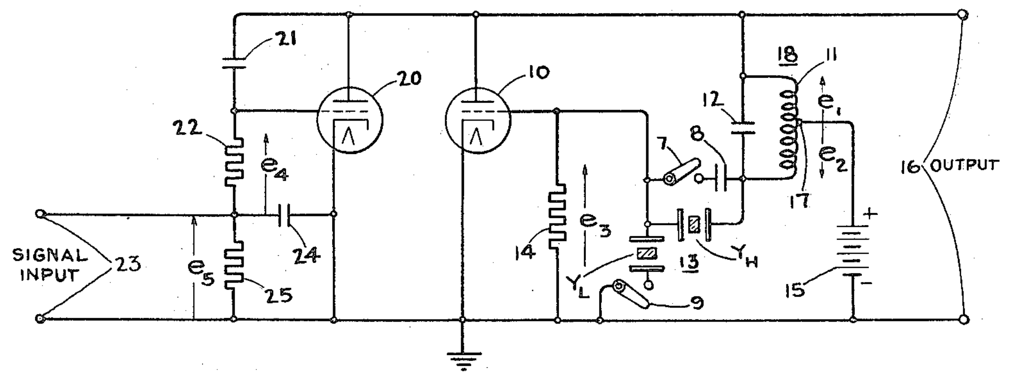

This invention relates generally to crystal stabilized oscillator circuits, and more particularly to such oscillators wherein the frequency of the output wave is to be varied in accordance with some signal.

In continuous wave telegraphy systems, the signal elements such as dots and dashes are normally communicated by transmitting a carrier wave, and the intervening spaces are marked by extinguishing the carrier wave. In certain applications, for instance in a telemetering system, it has been found advantageous to send the code characters, such as dots and dashes, as transmissions on one frequency, and the intervening spaces, as transmissions on a different frequency. Wtih this arrangement, commonly known as frequency shift keying, continuous transmission may be maintained, the signal components being identified by their frequencies.

For narrow-band telemetering and for pilot relaying, it is particularly advantageous to utilize two frequencies differing only by a small amount, as this makes it possible to transmit the required intelligence over a very narrow frequency spectrum. Such a system is described in my copending application Serial No. 702,377, filed October 10, 1946, now U. S. Patent Number 2,461,956 dated February 15, 1949, entitled Frequency Response Circuits and assigned to the same assignee as the present invention. The method telemetering therein described requires that either of two highly stable frequencies be instantly available for transmission over a power line.

A particular object of the present invention is to provide a circuit capable of generating oscillations at either of two frequencies with the stability required for such an application.

One prior art method of obtaining the required frequencies consists of switching the input of a high frequency amplifier from one oscillator to another, one oscillator operating at the frequency utilized for the transmission of the code signals and the other at the frequency utilized for the marking of the intervening spaces. By employing piezoelectric crystal oscillators, highly stable frequencies can be achieved by this method. However, since the switching from one stable frequency to the other may well occur when these two frequencies are as much as 180° apart in phase, a transient occurs which in practice limits the rate of keying to a value which may be insufficient for high speed telemetering.

Another prior art method of obtaining the required frequency shift consists of frequency-modulating an oscillator by means of a reactance valve. With this method, if the oscillator is of a type whose frequency of operation is determined by a resonant electrical network, the stability may be insufficient for the strict requirements of a narrow band telemetering system. I have found that the required frequency stability can be achieved by utilizing a crystal oscillator and my invention provides a new and improved means for frequency-modulating a crystal oscillator, the system having such characteristics of stability and frequency deviation as to make it particularly suitable for use in a telemetering system of the type generally described in my aforesaid application.

In one embodiment of my invention, I utilize an oscillator having a resonant network, consisting of inductance and capacitance, common to the input and output circuits of an electronic valve, and I insert a piezoelectric crystal filter in series between the input circuit and the resonant network. The frequency of operation then is determined primarily by the natural frequency of one or more crystals contained in the crystal filter and secondarily by the resonant frequency of the network. In parallel with the network I connect a reactance valve modulator which varies the resonant frequency of the network. The frequency of operation of the oscillator can then be varied through the control circuit of the reactance valve modulator and the change in frequency is then dependent upon the rate of change with frequency of the impedance of the network with respect to that of the crystal. In a preferred embodiment of my invention, I provide a filter comprising two piezoelectric crystals, one cut to a frequency slightly higher than the other. These crystals then determine the limits of the range through which the frequency of operation may be shifted. In practice, one crystal determines the frequency of transmission of code characters, whereas the other crystal determines the frequency of transmission of the intervening spaces.

Accordingly, it is an object of my invention to provide an improved circuit including a piezoelectric crystal oscillator and means for controlling the frequency of operation thereof.

A further object of my invention is to provide a crystal oscillator wherein the frequency of operation is normally maintained constant by means of a piezoelectric crystal and is varied to a desired extent by means of a reactance valve modulator.

Still a further object of my invention is to provide an oscillator wherein the frequency of operation can be varied, by means of an input signal, between two predetermined frequencies which are maintained constant by a filter containing a pair of piezoelectric crystals.

Figure 2:
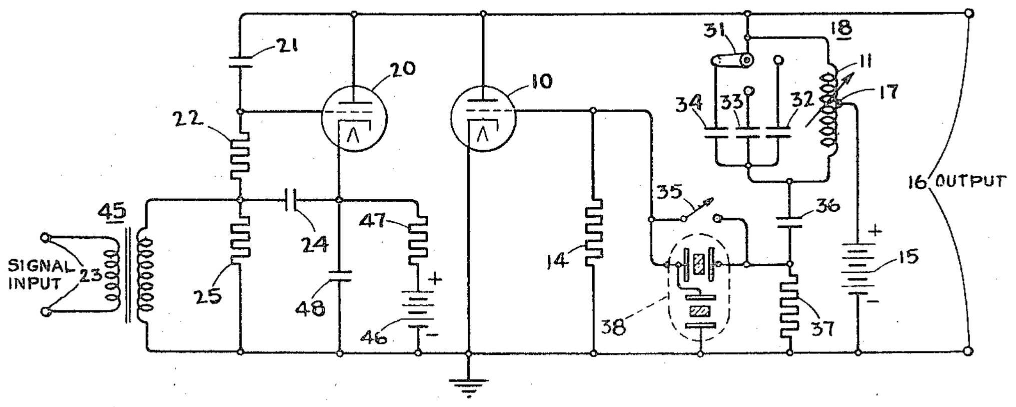
Figure 3:
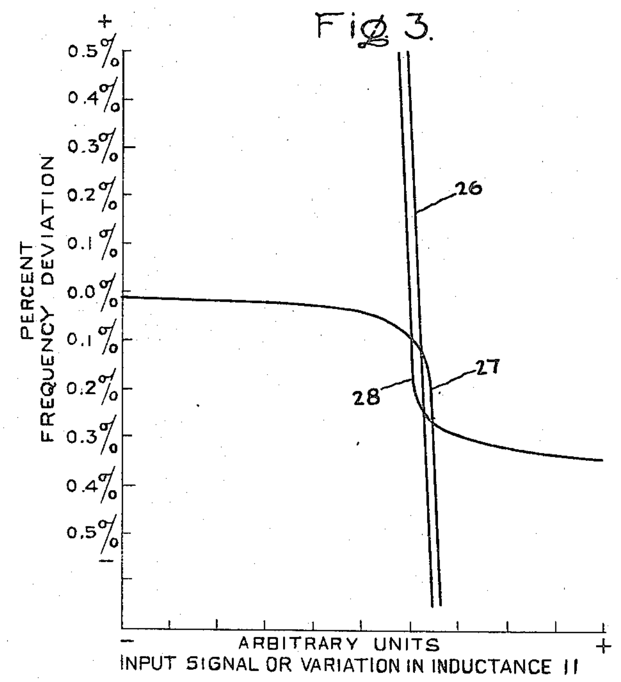
Figure 4:
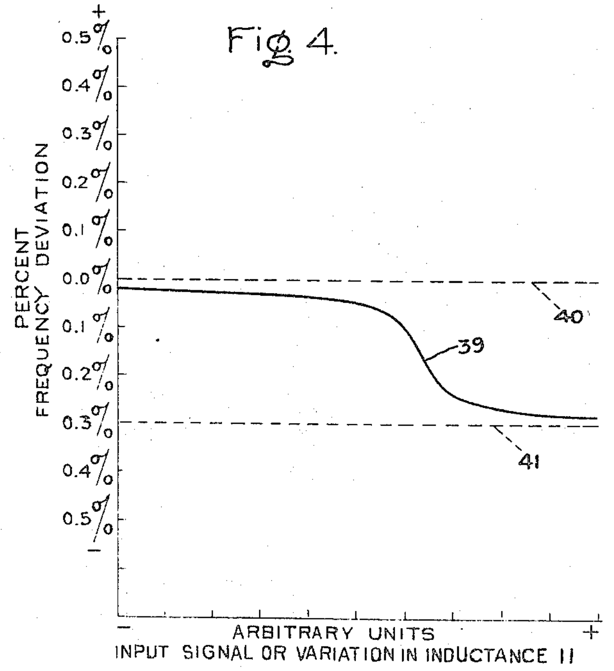

Further objects and advantages will appear from the following description taken in conjunction with the accompanying drawings, in which Fig. 1 is a circuit diagram of a circuit embodying my invention; Fig. 2 is a circuit diagram of a preferred embodiment of my invention into which certain modifications have been incorporated to provide greater flexibility of operation; and Figs. 3 and 4 represent certain operating characteristics of these circuits.

Referring to the drawings and more particularly to Fig. 1, there is shown an oscillator comprising a triode valve 10 of which the cathode is grounded and of which the anode is connected to the upper terminal of a network 18 comprising an inductance 11 and a capacitor 12. A suitable power supply source, such as a battery 15, supplies operating potential to the anode through a tap 17 on the inductance 11. The lower terminal of the network 18 is connected to the grid of the valve 10 through a piezoelectric crystal filter 13. The crystal filter contains a pair of crystals, $Y_H$ and $Y_L$, crystal $Y_H$ being serially connected between the lower terminal of network 18 and the grid of valve 10, and crystal $Y_L$ being connected between the grid of valve 10 and ground. A resistor 14 connected between the grid and ground establishes the proper operating potential by means of grid current flow. The output from the oscillator is available at terminals 16 which are connected directly to the anode and cathode of the oscillator valve, respectively. Alternatively, the output of the oscillator may be obtained from a winding, not shown in the drawing, inductively coupled to inductance 11.

A triode valve 20 serves as a reactance modulator and has its anode and cathode connected respectively to the anode and cathode of the oscillator valve 10. A capacitor 21 is connected between the anode and the grid of valve 20 and a resistor 22, in series with a capacitor 24, is connected between the grid and the cathode. Capacitor 21 is selected so that its reactance at the frequency of operation is much larger than the resistance of resistor 22. Accordingly, the current flowing through the combination will lead the alternating voltage $e_1$ existing at the anodes of valves 10 and 20 by almost 90°. The voltage $e_4$ developed by this current across the resistor 22 will then be in phase with the current and will also lead the voltage $e_1$ by almost 90°. Since the current generated by the valve is 180° out of phase with the grid voltage, this current will lag voltage $e_1$ by approximately 90°. Accordingly valve 20 behaves as an inductive circuit, and as is well known in the art, the effective magnitude of this equivalent inductance can be controlled by varying the voltage on the control grid. The variation of the voltage on the control grid is achieved by supplying a signal voltage to the terminals 23 so as to develop a voltage across a resistor 25 connected in parallel with the capacitor 24. The capacitor 24 effectively bypasses any current at the frequency of operation of the oscillator but has substantially no effect at the frequency of the signal voltage.

The input signal can be considered as causing a proportional change in an equivalent inductance connected in parallel with inductance 11 of the output network of the oscillator valve. The frequency of operation of the oscillator valve will not be determined directly by the resonant frequency of the network alone, but it will be determined by the resulting resonant frequency taking the network and the crystal into consideration as a whole. The actual operation of the circuit can be more easily explained by making reference to the voltages $e_1$—$e_4$ shown on Fig. 1 adjacent to the respective circuit elements in which each voltage exists. Assume for the moment that the circuit is already in an oscillating condition and that a voltage $e_1$, of the instantaneous phase indicated by the arrow, is produced by anode current in the section of the inductance 11 between the anode of valve 10 and tap 17. A voltage $e_2$, of opposite phase to $e_1$, is produced by mutual coupling in the section of the inductance between tap 17 and crystal filter 13. As a result of $e_2$, a voltage $e_3$ is produced at the grid of valve 10 having a phase relation determined by the impedance of the crystal filter 13 and the resistance 14. Due to the nature of the crystals contained in the filter, this phase relationship shifts very rapidly with frequency. Oscillation takes place at the point where the network 18 provides the proper relationship between anode current and anode voltage $e_1$. This latter relationship changes relatively slowly with frequency. As a result, a relatively large change in the equivalent inductance contained in the network 18, such as produced by a signal acting on the input circuit of the reactance modulator valve, will produce only a relatively small shift in frequency. In practice, a keying circuit may provide two selected values of voltage, in accordance with the coded characters to the input terminals 23, to cause the frequency shift.

The crystal filter 13 containes two crystals $Y_H$ and $Y_L$ which are cut respectively to produce the high and low frequency limits of the frequency shift desired. For instance, $Y_H$ is cut to offer a high parallel impedance at the frequency at which it is desired to transmit code characters, while $Y_L$ is cut to offer a high parallel impedance at the frequency at which it is desired to transmit the intervening spaces. However, crystal $Y_H$ may be used alone by open circuiting crystal $Y_L$, through switch 9, or crystal $Y_L$ may be used alone by connecting a large capacitance 8 in parallel with crystal $Y_H$ by closing switch 7.

Referring to Fig. 3 qualitative operating characteristics of the oscillator are shown for different combinations of the elements in the crystal filter, based on measured data. When both crystals are removed and a capacitance is substituted for crystal $Y_H$, the frequency deviation for a signal input or for a variation in the inductance of the network 18 is illustrated by curve 26. This curve shows a very rapid change in frequency for a comparatively small change in the input signal or in the inductance of network 18. When crystal $Y_H$ is used alone, the resulting frequency-signal characteristic is illustrated by curve 27. For a negative input signal, this curve asymptotically approaches a constant frequency which is the resonant frequency of the crystal $Y_H$. On the other hand, for a positive input signal, this curve asymptotically approaches curve 26, and shows a frequency-signal characteristic approaching that of the oscillator with both crystals removed. When crystal $Y_L$ is used alone and a capacitance is substituted for crystal $Y_H$, the resultant frequency-signal characteristic is illustrated by curve 28. This curve is the inverse of curve 27. It tends asymptotically to a constant frequency for a positive input signal, and approaches curve 26 for a negative input signal.

When both crystals are used, the resultant frequency-signal characteristic is illustrated by curve 39 of Fig. 4. This curve asymptotically approaches an upper and a lower frequency limit represented by the broken lines 40 and 41 respectively. These frequency limits are related to the frequencies to which the crystals have been cut, and can be moved closer together or farther apart by adjustment of the crystal frequencies. It will be observed that there is a small range through which the frequency shifts rapidly from one limit to the other for a comparatively small change in the input signal. On either side of this small range, the frequency changes very little no matter how large the change in the input signal.

It is evident from these curves that the most desirable filter for a frequency shift telemetering system is the one shown in the embodiment of Fig. 1 and comprising two crystals. By cutting crystal $Y_H$ to produce the frequency at which it is desired to transmit code characters, and crystal $Y_L$ to produce the frequency at which it is desired to transmit the intervening spaces, the two frequencies of operation of the telemetering system are definitely fixed. Provided that the input signal is large enough to cause the reactance modulator valve 20 to shift the frequency through the curved portion of curve 39, transmissions will occur at one or the other of the crystal frequencies independently of the absolute magnitude of the input signal. In other words, the circuit is equivalent to a pair of crystal oscillators operating on slightly different frequencies which can be alternately switched on or off in response to an input signal. However, contrary to the case where two crystal oscillators are used, with my invention, the switching occurs smoothly and with no discontinuity of phasing. This is a highly desirable characteristic as it permits high speed telemetering operation within a very narrow frequency spectrum.

In certain applications in which only one of the frequencies of transmission need be definitely fixed, the crystal filter 13 may be altered to include only one of the crystals $Y_H$ or $Y_L$. In such an embodiment, the frequency-signal characteristic would follow either one of curves 27 or 28 of Fig. 3 depending upon which crystal is utilized. This permits an accurate determination of one of the frequencies of transmission only, the other frequency being dependent on the magnitude of the input signal.

The embodiment of my invention shown in Fig. 1, provides an output which is highly stable with regards to frequency. Actual tests on an experimental construction of this embodiment have shown that the temperature drift experienced is approximately the same as would occur with any of the standard crystal oscillator circuits commonly known to the art, and that the stability is limited primarily by the crystals themselves. The shift in frequency occasioned by a signal supplied to the input of the reactance modulator valve is generally not large. For example, with crystals providing oscillations in the range between 70 and 200 kilocycles, a maximum deviation of $\pm 0.04\%$ has been obtained. However, the extent of the variation is very constant with respect to the magnitude of the signal input and, accordingly, the system meets the requirements necessary for a high speed telemetering system.

Referring to Fig. 2, there is shown an oscillator circuit embodying a preferred form of my invention which is very similar to that shown in Fig. 1, but which incorporates in addition certain modifications to permit greater flexibility in operation. The elements bearing the same numerals as those of Fig. 1 perform the same functions and they will not be described again. The circuit differs by the provision of a group of capacitors 32, 33, and 34 which can be selectively connected in parallel with inductance 11 by means of a switch 31. This is to permit efficient operation when crystal filters having different natural frequencies of resonance are inserted in a socket 38, indicated conventionally in dashed outline. Also inductance 11 has been provided with adjusting means, as indicated by the conventional arrow, to permit fine tuning. A switch 35 has been provided in parallel with the crystal which permits short-circuiting the crystal filter for certain operational requirements. A capacitor 36 has replaced the direct connection of the crystal $Y_H$ to the network 18 and the junction of this capacitor and the network has been connected to ground by a resistor 37. The purpose of this capacitor and resistor combination is to block the anode operating potential from the grid circuit so that the grid bias of the oscillator valve 10 will not be altered when the crystal is short-circuited. Also when the crystal is used, it prevents the anode operating potential from appearing across the crystal and reduces the possibility of failure of the crystal through the application of excessive voltages.

The input circuit to the reactance valve 20 has also been altered by the provision of a cathode bias circuit comprising battery 46, resistor 47, and capacitor 48 and an input transformer 45 whose primary is connected to the input terminals 23 and whose secondary is connected to the resistor 25. The input transformer permits efficient operation with low-frequency modulating voltages instead of a standard keying circuit.

The modified circuit of Fig. 2 permits operation on different frequencies by switching the output network 18. A different piezoelectric crystal can be inserted in the socket 38 for each operating frequency, or else the crystal can be short-circuited. When the crystal is short-circuited, the variation in frequency which occurs for a given signal supplied to the input of the reactance modulator valve will be much larger, as illustrated by curve 26 of Fig. 3. For example, in a particular system, tests showed that, with the crystals inserted, a given signal input voltage $e_4$ produced a $\pm 0.03\%$ variation in frequency, while with the crystal short-circuited, the same signal voltage $e_4$ caused $\pm 0.375\%$ variation in frequency. In certain applications where it is desirable to have a greater variation in frequency and where the accuracy requirements of the frequency shift are not as stringent, this switching arrangement is highly advantageous.

While certain specific embodiments have been shown and described, it will, of course, be understood that various other modifications may be made without departing from the invention. For instance, while I have shown a reactance modulating valve for the purpose of altering the resonant frequency of the network 18, any other type of circuit commonly known to the art may be substituted for it. In a simple code keying system, a relay may be used to short circuit part of inductance 11 and thereby change the resonant frequency of the network 18. The appended claims are therefore intended to cover any such modifications within the true spirit and scope of the invention.

What I claim as new and desire to secure by Letters Patent of the United States is:

1. In combination, a crystal oscillator comprising an electronic valve having an anode, a cathode and a control electrode, a circuit comprising a parallel combination of inductance and capacitance connected in series with a piezoelectric crystal filter, the free terminal of said circuit being connected to said anode and the free terminal of said crystal filter being connected to said control electrode, said filter containing a plurality of crystals having different natural frequencies of oscillation near the resonance frequency of said combination, and means to vary the resonance frequency of said combination whereby the frequency of oscillation of said circuit is varied by an amount dependent upon the rate of change with frequency of the impedance of said combination with respect to that of said crystal filter.

2. A variable frequency crystal stabilized oscillator comprising an electronic valve having an anode, a cathode and a control electrode, a network comprising an inductance and a capacitance in parallel, one terminal of said network having a connection to said anode, a source of operating potential connected between intermediate points in said network and said cathode, a filter containing a pair of piezoelectric crystals, one of said crystals being connected between the other terminal of said network and said control electrode, the other of said crystals being connected between said control electrode and said cathode, said crystals having resonant frequencies near the natural resonant frequency of said network, and means for varying said natural resonant frequency in accordance with a modulating signal whereby a variation in frequency, reduced in magnitude by the effect of said crystals, is obtained in said oscillator.

3. A variable frequency, crystal-stabilized oscillator comprising an electronic valve having an anode, a cathode and a control electrode, a two-terminal network comprising an inductance and a capacitance in parallel, said network having a predetermined natural resonant frequency, a connection between one terminal of said network and said anode, a source of operating potential connected to an intermediate point in said inductance, a piezoelectric crystal connected between the other terminal of said network and said control electrode, said crystal having a resonant frequency near said predetermined frequency, and means for varying said predetermined frequency in accordance with a modulating signal, said means comprising a reactance valve modulator connected in parallel with said network, said reactance valve providing in parallel with said network an equivalent reactance whose magnitude is controlled by said modulating signal.

4. An oscillator for producing an output at one or the other of two predetermined frequencies in response to a signal, comprising an electronic valve having an anode, a cathode, and a control electrode, a two-terminal network comprising an inductance and a capacitance in parallel, said network having a natural resonant frequency, a connection between one terminal of said network and said anode, a source of operating potential connected between an intermediate point in said inductance and said cathode, a first piezoelectric crystal connected between the other terminal of said network and said control electrode, a second piezoelectric crystal connected between said control electrode and said cathode, said crystals being cut respectively to resonate substantially at said two predetermined frequencies, and means to vary the resonant frequency of said network in response to said signal, whereby said output occurs at substantially one or the other of said predetermined frequencies.

5. An oscillator for producing an output at one or the other of two predetermined frequencies in response to a signal, comprising a first electronic valve having an anode, a cathode, and a control electrode, a two-terminal network comprising an inductance and a capacitance in parallel, said network having a natural resonant frequency, a connection between one terminal of said network and said anode, a source of operating potential connected between an intermediate point in said inductance and said cathode, a first piezoelectric crystal connected between the other terminal of said network and said control electrode, a second piezoelectric crystal connected between said control electrode and said cathode, said crystals being cut respectively to resonate substantially at said predetermined frequencies, and a second electronic valve connected as a reactance modulator in parallel with said first valve, said second valve having an input adapted to receive a signal for varying an equivalent reactance caused by said second valve in parallel with said first valve, whereby said output occurs at substantially one or the other of said predetermined frequencies.

ROBERT W. BECKWITH.

REFERENCES CITED

The following references are of record in the file of this patent:

UNITED STATES PATENTS

| Number | Name | Date |
|---|---|---|
| 1,761,882 | Eberhard | June 3, 1930 |
| 1,921,844 | Schumacher | Aug. 8, 1933 |
| 2,459,557 | Usselman | Jan. 18, 1949 |